United States Patent [19]
Sneep

[11] Patent Number: 6,011,424
[45] Date of Patent: Jan. 4, 2000

[54] INTEGRATED BIRECTIONAL TRANSISTOR SWITCH FOR LARGE SIGNAL VOLTAGES

[75] Inventor: Jacobus G. Sneep, Eindhoven, Netherlands

[73] Assignee: U.S. Philips Corporation, New York, N.Y.

[21] Appl. No.: 09/033,740

[22] Filed: Mar. 3, 1998

[30] Foreign Application Priority Data

Mar. 4, 1997 [EP] European Pat. Off. .............. 97200637

[51] Int. Cl.[7] .................................................. H03K 17/60
[52] U.S. Cl. ............................ 327/482; 327/77; 327/439
[58] Field of Search .................................. 327/77, 80, 81,
327/85, 87, 89, 419, 425, 438, 439, 445,
448, 453, 459, 460, 462, 463, 464, 465,
471, 474, 476, 478, 479, 482, 486, 488,
492, 468

[56] References Cited

U.S. PATENT DOCUMENTS 3,469,114  9/1969  Bentley .................................... 307/254

FOREIGN PATENT DOCUMENTS

0091119A2  5/1983  European Pat. Off. ....... H03K 17/68

*Primary Examiner*—Timothy P. Callahan
*Assistant Examiner*—Jeffrey Zweizig
*Attorney, Agent, or Firm*—Brian J. Wieghaus

[57] ABSTRACT

A birectional transistor switch for large signal voltages comprises a first (T1) and a second (T2) transistor arranged in series, which are supplied with base current under command of a control signal in order to short-circuit a signal terminal (ST) to a reference terminal (RT) which is connected to the substrate of the circuit. When the transistor switch is open large negative voltage excursions of the signal (U) on the signal terminal (ST) will fire a thyristor formed by the first transistor (T1) and a parasitic transistor (TP) and thus cause an undesired short-circuit between the signal terminal and the reference terminal (RT). This is prevented in that under these conditions the node (N) between the two transistors is short-circuited to the reference terminal (RT), as a result of which the loop gain in the thyristor becomes so small that this thyristor is no longer fired. The node (N) is short-circuited with the second transistor (T2) or a separate MOS transistor, which is controlled by a comparator (A1), which compares the signal (U) with a threshold value (UR1).

19 Claims, 4 Drawing Sheets

INTEGRATED BIRECTIONAL TRANSISTOR SWITCH FOR LARGE SIGNAL VOLTAGES

BACKGROUND OF THE INVENTION

The invention relates to a switching circuit comprising: a signal terminal for receiving a signal voltage; a reference terminal; a first transistor having a base, an emitter connected to the signal terminal, and a collector connected to a node; a second transistor of the same conductivity type as the first transistor and having a base, an emitter connected to the reference terminal, and a collector connected to the node; control means coupled to the base of the first transistor and to the base of the second transistor to turn on and turn off the first and the second transistor in response to a control signal so as to obtain a closed state and an open state, respectively, of the switching circuit.

Such a switching circuit is known from European Patent Application EP 0 091 119. Such switching circuits serve to short-circuit the signal voltage on the signal terminal to the reference terminal. A coupling capacitor connects the signal terminal to a signal source, as a result of which an a.c. signal appears on the signal terminal. This a.c. signal is short-circuited to the reference terminal under command of the control signal in the closed state of the switching circuit. For audio signals the switching circuit functions as a mute switch under control of a mute signal. For video signals the switching circuit operates as a clamp switch in response to a clamp signal. In the known switching circuit two transistors of the same conductivity type are arranged in series between the signal terminal and the reference terminal. The first transistor operates in the reverse mode and has its emitter connected to the signal terminal. The second transistor operates in the forward mode and has its emitter connected to the reference terminal. The collectors of the two transistors are connected to one another in the node. The control means include current sources which in the closed state of the switching circuit supply bias current to the bases of the two transistors under command of the control signal. The two transistors then form a low-impedance current path between the signal terminal and the reference terminal, as a result of which the signal voltage is short-circuited to the reference terminal. The known two-transistor series arrangement is better suitable for larger signal voltages than arrangements comprising only one transistor, which may or may not operate in the reverse mode, between the signal terminal and the reference terminal.

In the integrated circuits the reference terminal is often connected to the substrate of the semiconductor body of the integrated circuit. When it is assumed that the first and the second transistor are NPN transistors in a P substrate there will be a parasitic PNP transistor having its base, emitter and collector connected to the node between the collectors of the first and the second transistor, the reference terminal or substrate, and the base of the first transistor, respectively. The parasitic transistor and the first transistor form together a thyristor which is fired automatically when the signal voltage on the signal terminal is sufficiently negative. The result is that the signal terminal is short-circuited directly to the reference terminal or the substrate. This effect is undesirable if the switching circuit should be open-circuited, i.e. in the open state of the switching circuit when the two transistors must be cut off. The spontaneous firing of the thyristor consequently imposes a limit on the permissible amplitude of the signal voltage on the signal terminal.

SUMMARY OF THE INVENTION

It is an object of the invention to provide a switching circuit which is suitable for larger signal amplitudes on the signal terminal. To this end, the switching circuit of the type defined in the opening paragraph is characterized in that the switching circuit further comprises: means for comparing the signal voltage with a threshold value, and means for coupling the node to the reference terminal in response to the comparison during the open state of the switching circuit.

The short-circuit of the node to the reference terminal results in the open-loop gain in the thyristor being reduced considerably because the base-emitter junction of the parasitic PNP transistor is short-circuited. As a result of this, the thyristor is not fired in the case of negative signal voltages on the signal terminal. When the node is short-circuited to the reference terminal the collector of the first transistor, which operates in the reverse mode, is also short-circuited to the reference terminal. The voltage on the base of the first transistor is then approximately 0.7 V higher than the voltage on the reference terminal. However, for sufficiently large positive signal voltages on the signal terminal the reverse voltage across the base-emitter junction of the first transistor will become too high and the first transistor will break down. This is precluded by eliminating the short-circuit between the node and the reference terminal when the signal voltage exceeds the threshold voltage. The collector and hence the base of the first transistor is then floating with respect to the reference terminal and breakdown of the base-emitter junction of the first transistor is not possible. The threshold voltage is non-critical and is preferably somewhere between −0.5 V and +0.5 V relative to the voltage on the reference terminal.

To couple the node to the reference terminal in the open state of the switching circuit a first embodiment of the switching circuit is characterized in that the means for coupling comprise the second transistor. In the open state of the switching circuit the first and the second transistor are cut off. In this state the second transistor can be used to short-circuit the node to the reference terminal during negative signal excursions on the signal terminal. To drive the second transistor for this purpose an embodiment of the switching circuit is characterized in that the switching circuit comprises: a comparator having inputs for receiving the signal voltage and the threshold value, and having an output for supplying an activation signal; a bias current source; and means for coupling the bias current source to the base of the second transistor in response to the activation signal.

Another embodiment of the switching circuit is characterized in that the means for coupling include a MOS transistor having a control electrode, and having a conduction channel connected between the node and the reference terminal. The MOS transistor has the advantage of a substantially smaller current consumption when it is driven. For driving the MOS transistor the other embodiment is further characterized in that the switching circuit comprises: a comparator having inputs for receiving the signal voltage and the threshold value, and having an output for supplying an activation signal to the control electrode of the MOS transistor.

A further embodiment of the switching circuit is characterized in that the switching circuit further comprises a third transistor of the same conductivity type as the first and the second transistor and having an emitter connected to the base of the first transistor, a base connected to the emitter of the first transistor, and a collector connected to a supply terminal. The base-emitter junction of the third transistor limits the base-emitter reverse voltage to approximately 0.7 V. In the open state of the switching circuit this ensures that the cut-off base-emitter junction of the third transistor breaks down. The capacitance of the base-emitter junction further prevents the undesired forward conduction of the base-emitter junction of the first transistor in the case of negative signal excursions. This forward conduction is caused by the charging current of the base-collector capacitance of the first transistor. This charging current would bring the base-emitter junction of the first transistor into conduction. This is precluded by means of the additional capacitance of the base-emitter junction of the third transistor. Together with the base-collector capacitance of the first transistor this additional capacitance forms a capacitive voltage divider and prevents the base-emitter voltage of the first transistor from becoming large enough to drive the base-emitter junction into conduction.

In the open state of the switching circuit the node between the collectors of the first and the second transistor will follow the instantaneous value of the signal voltage in the case of a positive signal excursion on the signal terminal and will increase in a positive sense to the positive peak value of the signal excursion minus two diode voltages, i.e. those of the base-emitter junction of the third transistor and the base-collector junction of the first transistor. Once the signal voltage starts to decrease again the voltage on the node persists as a result of said two junctions being cut off. If upon the next negative voltage excursion the node is short-circuited to the reference terminal, either by means of the second transistor or by means of a separate MOS transistor, a current surge is produced, which gives rise to interference. In order to preclude this interference a further embodiment of the switching circuit is characterized in that the switching circuit further comprises a signal follower having an input for receiving the signal voltage on the signal terminal and having an output coupled to the node.

The signal follower ensures that the voltage on the node keeps in track with the voltage on the signal terminal and precludes the occurrence of current surges.

In the closed state of the switching circuit, i.e. when the first and the second transistor are both conductive, the first transistor operates in the reverse mode and the second transistor operates in the forward mode in the case of positive signal excursions. In the case of negative signal excursions the situation is reversed. In the forward mode the current gain of a transistor is much higher than in the reverse mode. The current-voltage characteristic and hence the resistance of a transistor are different in the reverse mode and in the forward mode. As a result, the voltage on the node fluctuates constantly about the voltage on the reference terminal. This voltage can become lower than −0.7 V, which results in a current to the substrate and causes interference. This effect can be opposed by means of an embodiment of the switching circuit, which for this purpose is characterized in that the control means comprise current sources, including one current source which can be coupled to the base of the second transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

The bias current for the bases of the first and the second transistor is thus varied depending on whether or not the relevant transistor operates in the reverse mode. In the reverse mode the relevant transistor receives more bias current than in the forward mode.

BRIEF DESCRIPTION OF THE DRAWINGS

These and other aspects of the invention will be described and elucidated with reference to the accompanying drawings, in which.

In these Figures like parts bear the same reference symbols.

DETAILED DESCRIPTION OF THE PREFERRED EMBODIMENTS

Figure 1:
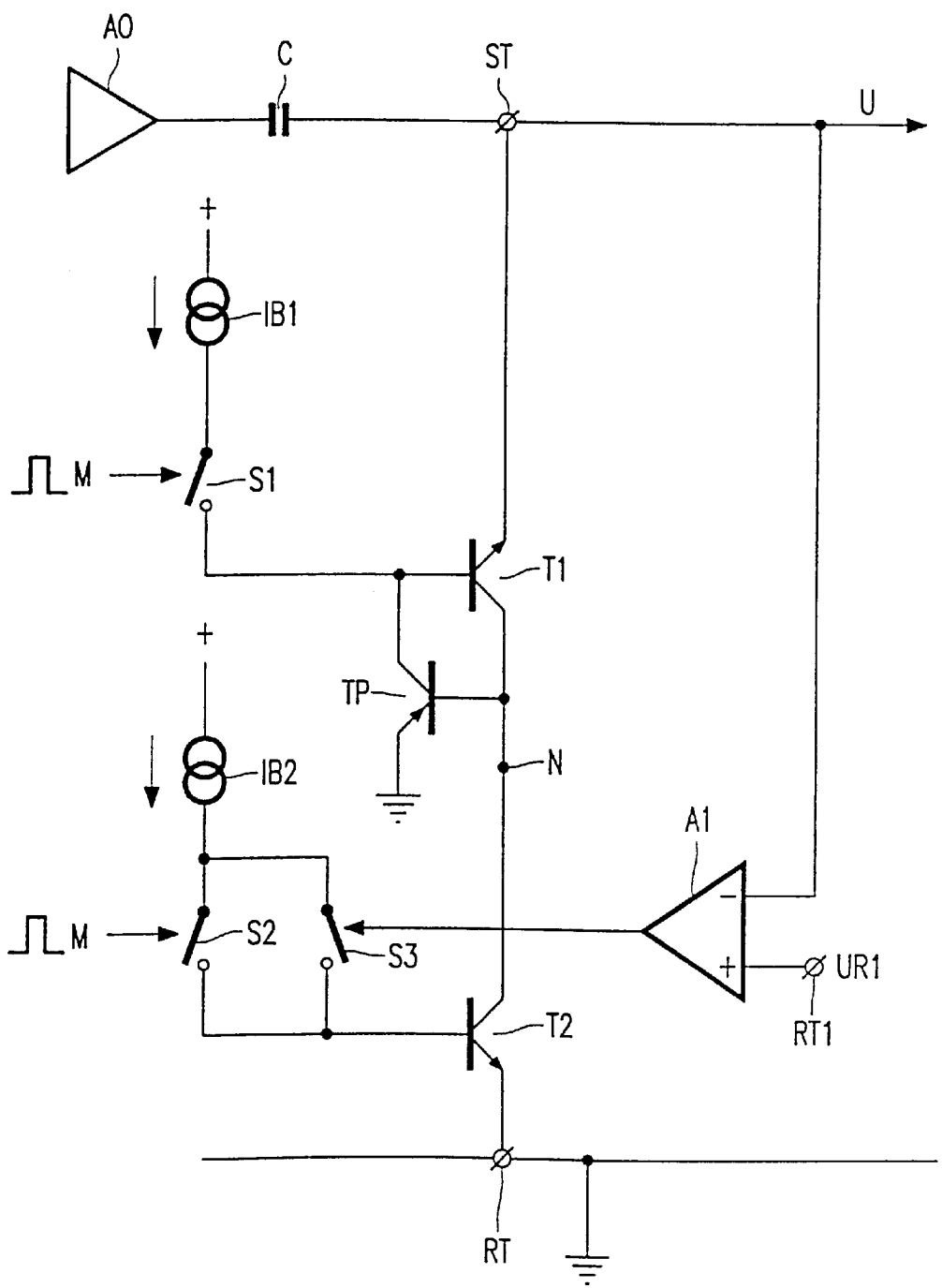
FIG. 1 shows a first embodiment of a switching circuit in accordance with the invention.

FIG. 1 shows a first embodiment of the switching circuit in accordance with the invention. A signal source AO supplies a signal U to a signal terminal ST via a coupling capacitor C. Under command of a control signal M the switching circuit short-circuits the signal U to a reference terminal RT which is connected to signal ground. The signal U can be, for example, an audio signal short-circuited by a mute signal. The switching circuit then functions as a mute switch. Alternatively, the signal U can be a video signal, in which case the control signal is a clamp signal. The switching circuit then functions as a video clamp circuit and can be used, for example, in video cameras.

Short-circuiting is effected by means of two NPN transistors T1 and T2 arranged in series between the signal terminal ST and the reference terminal RT. It will be evident that it is also possible to use PNP transistors instead of NPN transistors, in which case the polarity of the power supply and signals should be reversed. The transistor T1 has its emitter connected to the signal terminal ST and the transistor T2 has its emitter connected to the reference terminal RT. The collectors of the transistors T1 and T2 are connected to one another in a node N. The transistor T1 operates in the reverse mode and the transistor T2 operates in the forward mode when the signal U is positive with respect to the reference terminal RT. The situation is the other way around when the signal U is negative with respect to the reference terminal RT.

In order to short-circuit the signal terminal ST to the reference terminal RT the transistors T1 and T2 are both turned on under command of the control signal M by applying a drive current to the bases of the transistors T1 and T2. The bias current for the base of the transistor T1 is supplied by a current source IB1, which is connected to the base of the transistor T1 via a switch S1. The switch S1 is closed under command of the control signal M. Instead of a current source a resistor can be used. It is alternatively possible to use a switchable current source in the form of a current mirror whose output is connected to the base of the transistor T1 and whose input is supplied with current by means of a switching transistor. Likewise, the base of the transistor T2 is supplied with bias current by means of a current source IB2 and a switch S2, which is also actuated by the control signal M. When the switches S1 and S2 are closed the transistors T1 and T2 conduct and the switching circuit is in the closed state. When the switches S1 and S2 are open the transistors T1 and T2 are cut off and the switching circuit is in the open state.

In integrated circuits all transistors are formed in a substrate, which is a P-type substrate in the case of NPN transistors. The substrate is often connected to signal ground and, consequently, to the reference terminal RT. As a result of this, a parasitic PNP transistor TP is formed, which has its emitter connected to the substrate and to the reference terminal RT, its base to the collector of the transistor T1, and its collector to the base of the transistor T1. The transistor T1 and the parasitic transistor TP form together a thyristor.

When the switching circuit is in the open state, i.e. when the transistors T1 and T2 are cut off, the thyristor will be turned on in the case of a negative-going signal U and will spontaneously cause an undesired short-circuit between the signal terminal ST and the substrate. However, this is prevented by short-circuiting the node N to the reference terminal RT, which is connected to the substrate. A consequence of this short-circuit is that a collector current of the transistor T1 cannot flow into the base of the parasitic transistor TP and thus cannot increase as a result of the loop gain. The thyristor is not ignited, as a result of which very large negative signal voltages can appear on the signal terminal ST.

The node N can be short-circuited by means of the transistor T2. For this purpose, the base of the transistor T2 is connected to the current source IB2 via a switch S3. The switch is closed by a comparator A1, which compares the signal U on the signal terminal ST with a reference voltage UR1 on a reference terminal RT1. The reference voltage UR1 is non-critical and is for example −0.1 V. As soon as the signal U becomes smaller than −0.1 V, the comparator A1 closes the switch S3 and the transistor T2 is driven into conduction, as a result of which the node is short-circuited to the reference terminal RT.

The emitter follows the positive voltage on the signal terminal ST for positive values of the signal U. However, the base and the collector of the transistor T1 remain at the voltage of the reference terminal RT if the transistor T2 remains conductive. As a result, the reverse voltage across the base-emitter junction of the transistor T1 would become so large that this junction would break down and the transistor T1 would become defective. This is prevented in that the short-circuit between the node N and the reference terminal RT is removed when the voltage of the signal U exceeds the reference voltage UR1. The node N and, consequently, also the collector and the base of the transistor T1 then float with respect to the reference terminal RT and follow the emitter voltage of the transistor T1.

Figure 2:
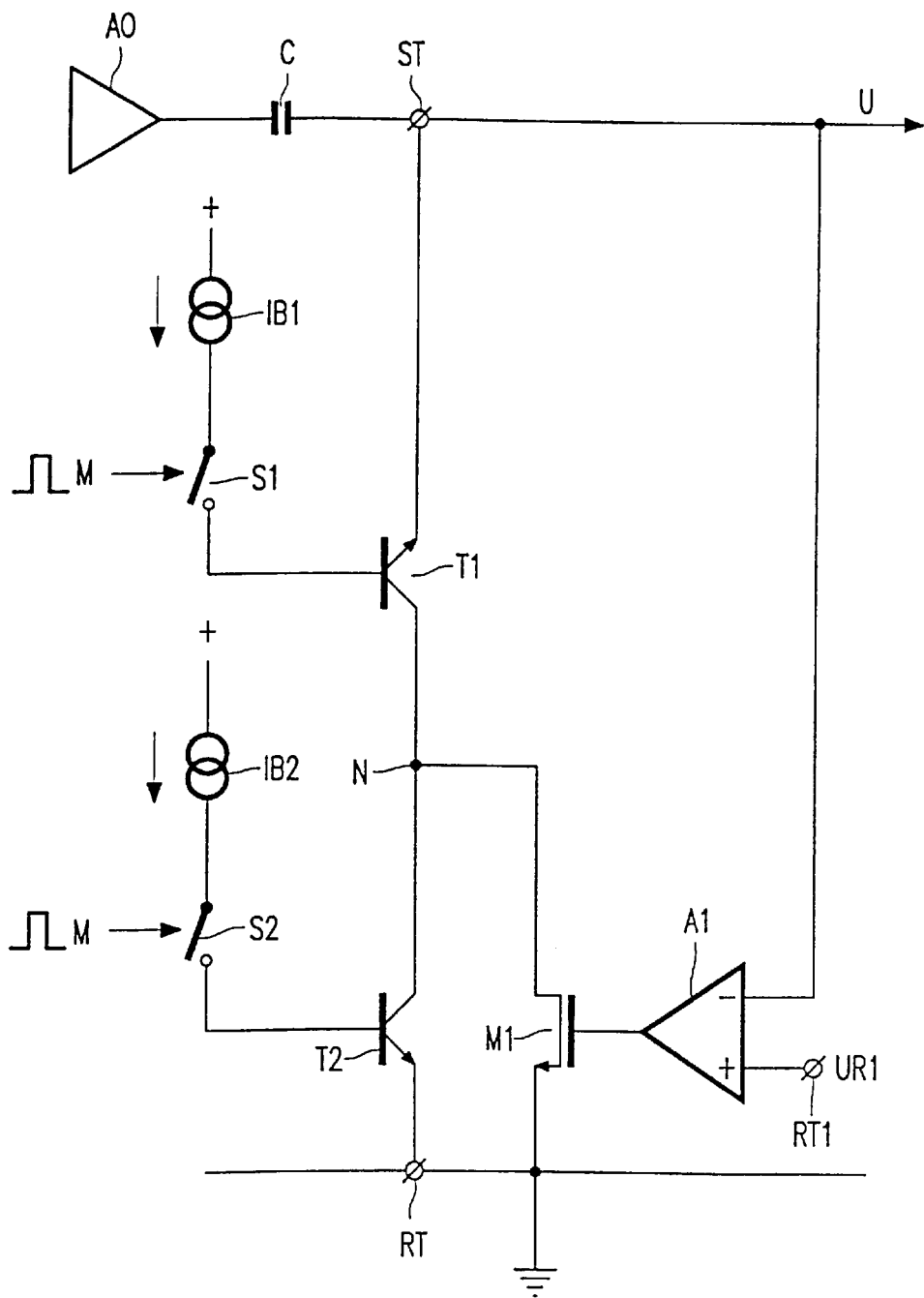
FIG. 2 shows a second embodiment of a switching circuit in accordance with the invention.

FIG. 2 shows an embodiment having an alternative arrangement for short-circuiting the node N to the reference terminal RT in the open state of the switching circuit. Instead of the transistor T2 this embodiment uses a MOS transistor M1, which is connected between the node N and the reference terminal RT and whose gate is driven by the comparator A1. The advantage of the MS transistor is the smaller current consumption as compared with the drive of the transistor T2.

Figure 3:
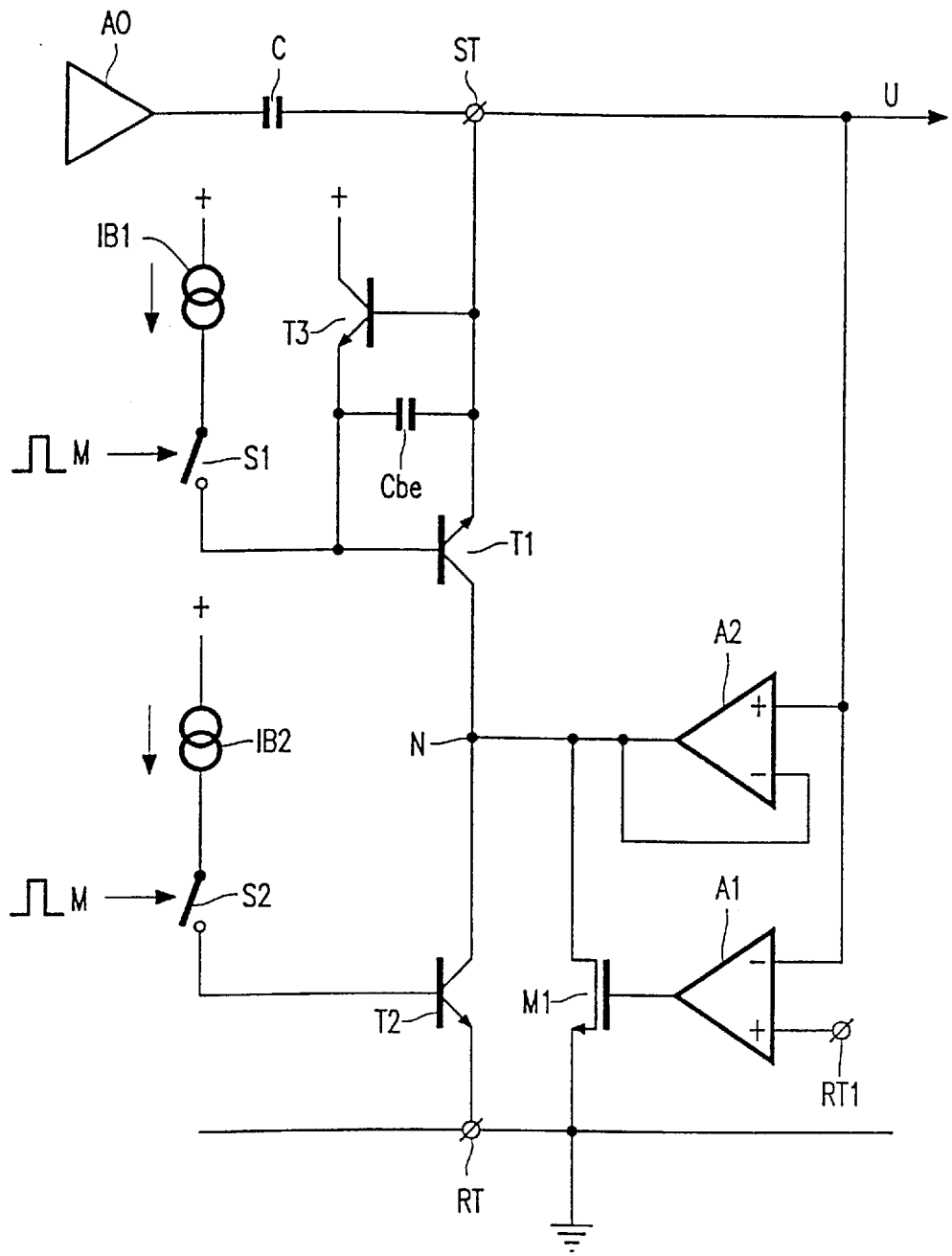
FIG. 3 shows a third embodiment of a switching circuit in accordance with the invention.

FIG. 3 shows an embodiment comprising an NPN transistor T3, which has its emitter connected to the base of the transistor T1, its base to the emitter of the transistor T1, and its collector to a positive supply voltage. The circuit further includes a signal follower A2, which buffers the signal U on the signal terminal ST and applies it to the node N. For the rest the circuit is identical to that shown in FIG. 2.

In the open state of the switching circuit the emitter of the transistor T1 follows the voltage on the signal terminal ST. The voltage on the emitter of the transistor T1 can increase more rapidly than the voltage on the base of the transistor T1. A consequence of this is that the base-emitter reverse voltage of the transistor T1 can become too large, as result of which the transistor breaks down and becomes defective. The transistor T3 limits the reverse voltage across the base-emitter junction of the transistor T1 to one diode voltage and prevents the transistor T1 from becoming defective.

The voltage on the node N does follow positive-going voltage excursions of the signal U via the conducting base-emitter junction of the transistor T3 and the collector-base junction of the transistor T1. However, in the case of negative-going voltage excursions these two junctions are cut off and the voltage on the node N remains at the maximum positive voltage minus two diode voltages. Upon the next negative voltage excursion of the signal U the transistor M1 will short-circuit the node N to the reference terminal RT. This results in a current surge which gives rise to interference. The signal follower A2 precludes these current surges because now the node N always tracks the instantaneous value of the signal U and cannot remain stuck at a high positive voltage.

At large negative-going voltage excursions of the signal U the base-emitter junction of the transistor T1 can become conductive as a result of the collector-base capacitance of the transistor T1 being discharged via the base-emitter junction of the transistor T1. This undesired effect can be avoided by arranging an additional capacitance across the base-emitter junction of the transistor T1. The base-emitter capacitance Cbe of the transistor T3 can be used advantageously for this purpose. The collector-base capacitance of the transistor T1 and the additional capacitance Cbe form a capacitive voltage divider, which limits the voltage drop across the base-emitter junction of the transistor T1 to such a low value that under these conditions the voltage across the base-emitter junction of the transistor T1 is too small to drive this junction into conduction.

Figure 4:
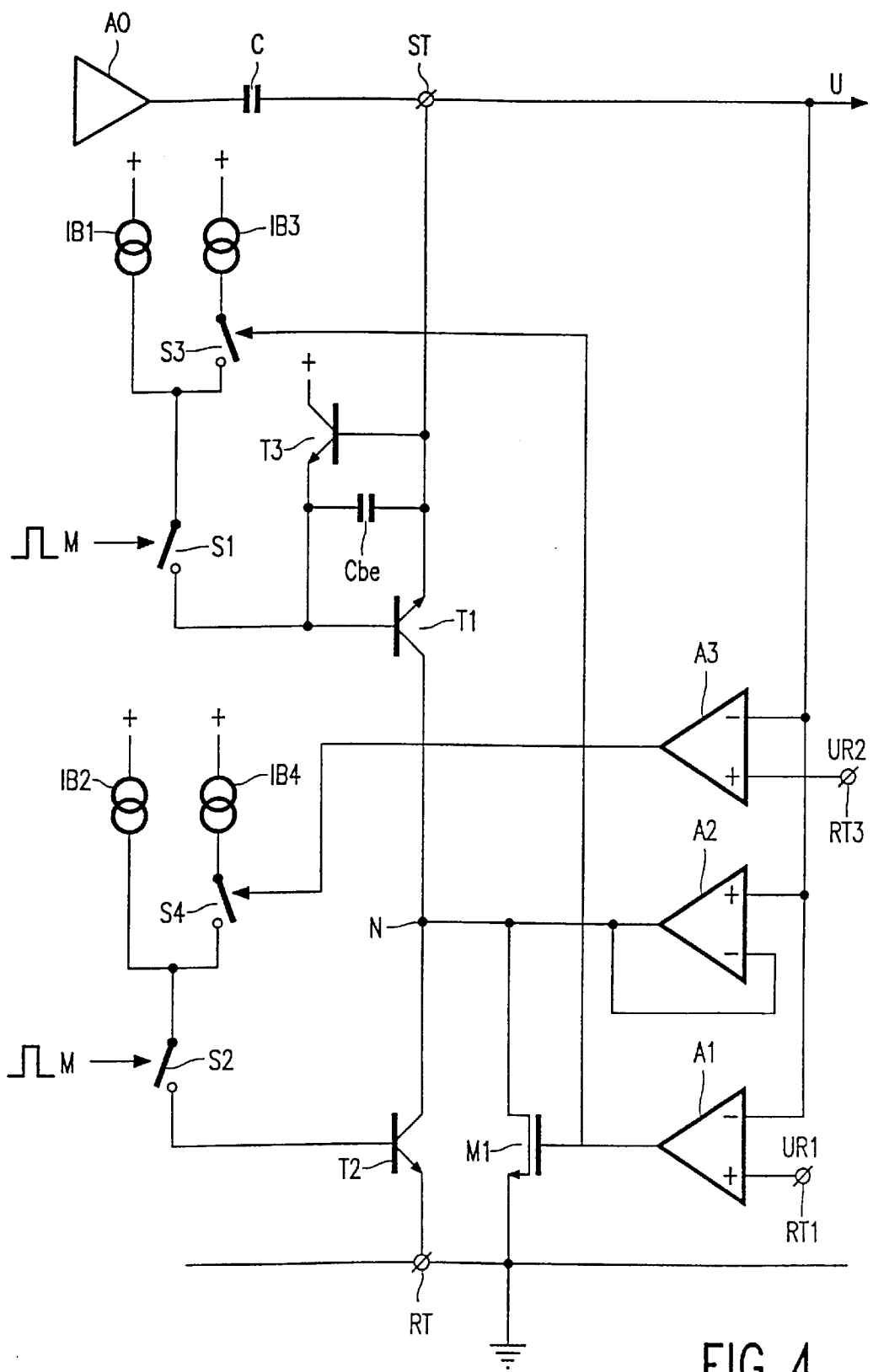
FIG. 4 shows a fourth embodiment of a switching circuit in accordance with the invention.

FIG. 4 shows an embodiment comprising an extension with respect to the embodiment shown in FIG. 3. In the closed state of the switching circuit, i.e. when the switches S1 and S2 are closed and the transistors T1 and T2 both conduct, the current sources IB1 and IB2 operate as current sources with variable current intensities. This can be achieved, for example, by means of a current source IB3, which can be arranged in parallel with the current source IB1 by means of a switch S3, and a current source IB4, which can be arranged in parallel with the current source IB2 by means of a switch S4. However, the current sources IB1 and IB2 can alternatively be controllable sources. The switch S3 is controlled by the comparator A1 and is closed when the signal U is positive, i.e. larger than the reference voltage UR1, which is preferably −0.1 V. The transistor T1 then operates in the reverse mode and consequently has a comparatively small current gain, which is compensated for by the larger bias current to the base of the transistor T1. The switch S4 is controlled by a comparator A3 and is closed when the signal U is negative, i.e. at least smaller than the reference voltage UR2 on a reference terminal RT3, which reference voltage is preferably +0.1 V and with which the comparator A3 compares the signal U on the signal terminal ST. The transistor T2 then operates in the reverse mode and consequently has a comparatively small current gain, which is compensated for by the larger bias current to the base of the transistor T2. Thus, a symmetrical voltage-current characteristic is obtained in the closed state of the switching circuit. Moreover, interference as a result of current to the substrate is prevented. Without the compensation the voltage on the node N would fluctuate continually in the case of polarity changes of the signal U. Such a fluctuating voltage can become smaller than −0.7 V, which would give rise to a current to the substrate, resulting in interference.

I claim:

1. A switching circuit, comprising: a signal terminal for receiving a signal voltage; a reference terminal; a first transistor having a base, an emitter connected to the signal terminal, and a collector connected to a node; a second transistor of the same conductivity type as the first transistor and having a base, an emitter connected to the reference terminal, and a collector connected to the node; control means coupled to the base of the first transistor and to the base of the second transistor to turn on and turn off the first and the second transistor in response to a control signal so as to obtain a closed state and an open state, respectively, of the switching circuit, characterized in that the switching circuit further comprises: means for comparing the signal voltage with a threshold value, and means for coupling the node to the reference terminal in response to the comparison during the open state of the switching circuit.

2. A switching circuit as claimed in claim 1, the means for coupling include the second transistor.

3. A switching circuit as claimed in claim 2, characterized in that the switching circuit comprises: a comparator having inputs for receiving the signal voltage and the threshold value, and having an output for supplying an activation signal; a bias current source; and means for coupling the bias current source to the base of the second transistor in response to the activation signal.

4. A switching circuit as claimed in claim 1, characterized in that the means for coupling include a MOS transistor having a control electrode, and having a conduction channel connected between the node and the reference terminal.

5. A switching circuit as claimed in claim 4, characterized in that the switching circuit comprises: a comparator having inputs for receiving the signal voltage and the threshold value, and having an output for supplying an activation signal to the control electrode of the MOS transistor.

6. A switching circuit as claimed in claim 5, characterized in that the switching circuit further comprises a third transistor of the same conductivity type as the first and the second transistor and having an emitter connected to the base of the first transistor, a base connected to the emitter of the first transistor, and a collector connected to a supply terminal.

7. A switching circuit as claimed in claim 6, characterized in that the switching circuit further comprises a signal follower having an input for receiving the signal voltage on the signal terminal and having an output coupled to the node.

8. A switching circuit as claimed in claim 7, characterized in that the control means comprise current sources, including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

9. A switching circuit as claimed in claim 6, characterized in that the control means comprise current sources, including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

10. A switching circuit as claimed in claim 5, characterized in that the control means comprise current sources, including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

11. A switching circuit as claimed in claim 4, characterized in that the control means comprise current sources, including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

12. A switching circuit as claimed in claim 3, characterized in that the control means comprise current sources, including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

13. A switching circuit as claimed in claim 2, characterized in that the control means comprise current sources including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

14. A switching circuit as claimed in claim 1, characterized in that the control means comprise current sources including one current source which can be coupled to the base of the first transistor and including another current source which can be coupled to the base of the second transistor to supply bias current to the first and the second transistor during the closed state of the switching circuit, and the switching circuit further comprises means for varying the magnitude of the bias current from at least one of the current sources in response to a comparison of the signal voltage with a further threshold value.

15. A switching circuit as claimed in claim 4, characterized in that the switching circuit further comprises a third transistor of the same conductivity type as the first and the second transistor and having an emitter connected to the base of the first transistor, a base connected to the emitter of the first transistor, and a collector connected to a supply terminal.

16. A switching circuit as claimed in claim 3, characterized in that the switching circuit further comprises a third transistor of the same conductivity type as the first and the second transistor and having an emitter connected to the base of the first transistor, a base connected to the emitter of the first transistor, and a collector connected to a supply terminal.

17. A switching circuit as claimed in claim 2, characterized in that the switching circuit further comprises a third transistor of the same conductivity type as the first and the second transistor and having an emitter connected to the base of the first transistor, a base connected to the emitter of the first transistor, and a collector connected to a supply terminal.

18. A switching circuit as claimed in claim 1, characterized in that the switching circuit further comprises a third transistor of the same conductivity type as the first and the second transistor and having an emitter connected to the base of the first transistor, a base connected to the emitter of the first transistor, and a collector connected to a supply terminal.

19. A switching circuit as claimed in claim 18, characterized in that the switching circuit further comprises a signal follower having an input for receiving the signal voltage on the signal terminal and having an output coupled to the node.

\* \* \* \* \*